United States Patent
Park et al.

(10) Patent No.: US 9,508,782 B2
(45) Date of Patent: Nov. 29, 2016

(54) ORGANIC LIGHT EMITTING DISPLAY AND METHOD OF MANUFACTURING THE SAME

(71) Applicant: SAMSUNG DISPLAY CO., LTD., Yongin, Gyeonggi-Do (KR)

(72) Inventors: Jong-Hyun Park, Yongin (KR); Chun-Gi You, Yongin (KR); Sun Park, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 9 days.

(21) Appl. No.: 14/248,257

(22) Filed: Apr. 8, 2014

(65) Prior Publication Data
US 2015/0084008 A1    Mar. 26, 2015

(30) Foreign Application Priority Data
Sep. 24, 2013    (KR) .......................... 10-2013-0113479

(51) Int. Cl.
H01L 27/32    (2006.01)
H01L 51/56    (2006.01)

(52) U.S. Cl.
CPC ....... *H01L 27/3276* (2013.01); *H01L 27/3265* (2013.01)

(58) Field of Classification Search
None
See application file for complete search history.

(56) References Cited

U.S. PATENT DOCUMENTS

| | | |
|---|---|---|
| 2002/0003587 A1 | 1/2002 | Tsujimura et al. |
| 2004/0097020 A1 | 5/2004 | Kim |
| 2006/0081845 A1 | 4/2006 | Bae |
| 2010/0193790 A1* | 8/2010 | Yeo ...................... H01L 27/3248 257/59 |
| 2010/0201609 A1 | 8/2010 | Kim |
| 2011/0121302 A1* | 5/2011 | Lee ...................... H01L 27/3262 257/59 |
| 2012/0146060 A1* | 6/2012 | Moon .................. H01L 27/3276 257/88 |
| 2013/0126882 A1 | 5/2013 | You et al. |

FOREIGN PATENT DOCUMENTS

| | | |
|---|---|---|
| JP | 2002-43575 | 2/2002 |
| KR | 1997-0053623 | 7/1997 |
| KR | 10-2006-0033240 | 4/2006 |
| KR | 10-2013-0055446 | 5/2013 |

* cited by examiner

*Primary Examiner* — Calvin Choi
*Assistant Examiner* — Xiaoming Liu
(74) *Attorney, Agent, or Firm* — Lewis Roca Rothgerber Christie LLP

(57) ABSTRACT

An organic light emitting display device including a thin film transistor including an active layer, a gate electrode, a source electrode, a drain electrode, a source electrode top layer on the source electrode and a drain electrode top layer on the drain electrode, a first insulating layer between the active layer and the gate electrode, and a second insulating layer between the gate electrode and the source and drain electrodes; a pad electrode including a first pad layer at the same level as the source electrode and a second pad layer on the first pad layer and at the same level as the source and drain electrode top layers; a third insulating layer covering end portions of the source, drain, and pad electrodes and including an organic insulating layer; and a pixel electrode in an opening formed in the third insulating layer and including a semi-transmissive metal layer.

15 Claims, 11 Drawing Sheets

ORGANIC LIGHT EMITTING DISPLAY AND METHOD OF MANUFACTURING THE SAME

CROSS-REFERENCE TO RELATED APPLICATION

This application claims priority to and the benefit of Korean Patent Application No. 10-2013-0113479, filed on Sep. 24, 2013 in the Korean Intellectual Property Office, the disclosure of which is incorporated herein in its entirety by reference.

BACKGROUND

1. Field

Aspects of one or more embodiments of the present invention relate to an organic light emitting display device and a method of manufacturing the organic light emitting display device, and more particularly, to an organic light emitting display device having excellent display quality and a method of manufacturing the organic light emitting display device.

2. Description of the Related Art

An organic light emitting display includes a hole injection electrode, an electron injection electrode, and an organic emitting layer formed between the hole and electron injection electrodes, and is a self-emissive display device that emits light when holes injected by the hole injection electrode and electrons injected by the electron injection electrode recombine in the organic emitting layer to create exitons. The organic light emitting display has qualities such as low power consumption, high luminance, and a high response speed, and is thus regarded as a next-generation display device.

SUMMARY

Aspects of one or more embodiments of the present invention are directed toward an organic light emitting display device having an excellent display quality.

Additional aspects and features will be set forth in part in the description which follows and, in part, will be apparent from the description or may be learned by practice of the present invention.

According to one or more embodiments of the present invention, an organic light emitting display device includes: a thin film transistor including an active layer, a gate electrode, a source electrode, a drain electrode, a source electrode top layer on the source electrode, and a drain electrode top layer on the drain electrode, a first insulating layer between the active layer and the gate electrode, and a second insulating layer between the gate electrode and the source electrode and the drain electrode; a pad electrode including a first pad layer at the same level as the source electrode and the drain electrode and a second pad layer on the first pad layer and at the same level as the source electrode top layer and the drain electrode top layer; a third insulating layer covering end portions of the source electrode, the drain electrode, and the pad electrode, the third insulating layer including an organic insulating material; a pixel electrode in an opening at the third insulating layer and including a semi-transmissive metal layer; a fourth insulating layer having an opening corresponding to the opening at the third insulating layer and covering an end portion of the pixel electrode; an organic emitting layer on the pixel electrode; and an opposite electrode on the organic emitting layer.

The second pad layer may include a transparent conductive oxide.

The transparent conductive oxide may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The source electrode and the drain electrode may each include a plurality of layers of metals having different electron mobilities.

The organic light emitting display device may further include a capacitor including a first electrode at the same level as the active layer, and a second electrode at the same level as the gate electrode.

The second electrode of the capacitor may include a transparent conductive oxide.

The capacitor may further include a third electrode at the same level as the source electrode and the drain electrode, and a third electrode top layer on the third electrode and at the same level as the second pad layer.

The organic light emitting display device may further include a pixel electrode contact portion that electrically couples the pixel electrode to the source electrode or the drain electrode through a contact hole in the third insulating layer, and wherein the pixel electrode contact portion may further include a first contact layer including the same material as the source electrode and the drain electrode, a second contact layer including the same material as the second pad layer, and a third contact layer between the first and second insulating layers and includes the same material as the second electrode of the capacitor, wherein the first contact layer is electrically coupled the third contact layer through a contact hole formed in the second insulating layer.

An end portion of the third contact layer may protrude into the opening in the second insulating layer, and the pixel electrode may contact the end portion of the third contact layer through a contact hole formed in the third insulating layer.

The pixel electrode contact portion may further include a fourth contact layer between the third contact layer and the first contact layer, and the pixel electrode contact portion may include the same material as the gate electrode.

The first pad layer may include the same material as the source electrode and the drain electrode.

The semi-transmissive metal layer may be silver (Ag) or a silver (Ag) alloy.

An opening in the second insulating layer, an opening in the third insulating layer, and an opening in the fourth insulating layer may overlap each other.

The opening in the third insulating layer may be larger than the opening in the fourth insulating layer but may be smaller than the opening in the second insulating layer.

The opposite electrode may include a reflective metal layer.

According to one or more embodiments of the present invention, a method of manufacturing an organic light emitting display device includes: performing a first mask operation in which a semiconductor layer is formed on a substrate, and the semiconductor layer is patterned to form an active layer of a thin film transistor and a first electrode of a capacitor; performing a second mask operation in which a first insulating layer is formed, and a transparent conductive oxide layer is formed on the first insulating layer, and the transparent conductive oxide layer is patterned to form a second electrode of the capacitor; performing a third mask operation in which a first metal layer is formed, and the first metal layer is patterned to form a gate electrode of the thin film transistor at the same level as the second electrode; performing a fourth mask operation in which a second insulating layer is formed, and a contact hole exposing a portion of the active layer is formed in the second insulating layer, and a first opening is formed in an area separated from the active layer; performing a fifth mask operation in which a second metal layer and a transparent conductive oxide layer are formed, and the second metal layer is patterned to form a source electrode, a drain electrode, and a first pad layer of a pad electrode, and the transparent conductive oxide layer is patterned to form a source electrode top layer on the source electrode, a drain electrode top layer on the drain electrode, and a second pad layer on the first pad layer; performing a sixth mask operation in which a third insulating layer including an organic insulating layer is formed, and a second opening that is smaller than the first opening is formed in the third insulating layer at an area overlapping the first opening, and a thinner portion of the third insulating layer that does not expose a top surface of the second pad layer is formed by removing a portion of the third insulating layer formed on the second pad layer; performing a seventh mask operation in which a semi-transmissive metal layer is formed, and the semi-transmissive metal layer is patterned to form a pixel electrode at the second opening, and an opening that exposes the top surface of the second pad layer is formed; and performing an eighth mask operation in which a fourth insulating layer including an organic insulating layer is formed, and a third opening that exposes a top of the pixel electrode is formed.

A half-tone mask including a semi-transmissive portion at a position corresponding to the second pad layer may be utilized in the sixth mask operation.

A thickness of the thinner portion of the third insulating layer in the sixth mask operation may be in a range of about 3,000 Å to about 10,000 Å.

The thinner portion of the third insulating layer may be removed by ashing or stripping in the seventh mask operation.

After forming the gate electrode, source and drain areas of the active layer and the first electrode of the capacitor may be concurrently doped with ion impurities.

A protection layer including a transparent conductive oxide may be further formed on a top surface of the semi-transmissive metal layer, and the semi-trasmissive metal layer and the protection layer may be concurrently patterned.

According to one or more embodiments of the present invention, a method of manufacturing an organic light emitting display device includes wet-etching the first metal layer, the second metal layer, the transparent conductive oxide layer, and the semi-transmissive metal layer.

When patterning the second metal layer, a first contact layer of a pixel contact portion may be formed, and a second contact layer may include a transparent conductive oxide and may be formed on the first contact layer and a contact hole may be formed when patterning the third insulating layer.

A third contact layer may be formed of a transparent conductive oxide, which the second electrode of the capacitor may also be formed of, and a fourth contact hole may be formed in the first metal layer, and a contact hole may be formed in the third insulating layer to couple (e.g., to connect) the pixel electrode and the first contact layer.

The example embodiments may be implemented by utilizing a system, a method, a computer program, or a combination of the system, the method, and the computer program.

BRIEF DESCRIPTION OF THE DRAWINGS

These and/or other aspects and features will become apparent and more readily appreciated from the following description of the embodiments, taken in conjunction with the accompanying drawings in which.

DETAILED DESCRIPTION

Figure 1:
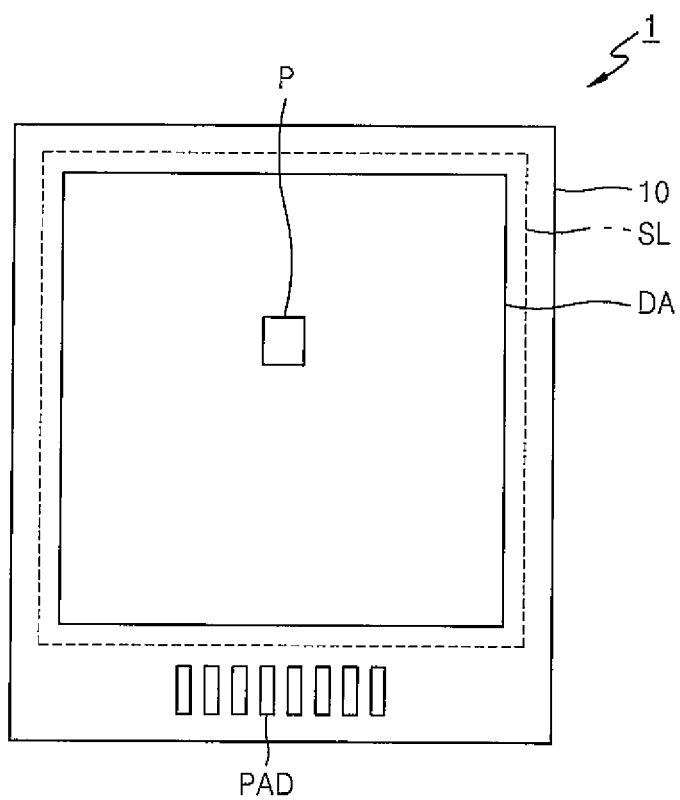
FIG. 1 is a schematic plan view illustrating an organic light emitting display device according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present invention. As used herein, the term "and/or" includes any and all combinations of one or more of the associated listed items. Expressions such as "at least one of," when preceding a list of elements, modify the entire list of elements and do not modify the individual elements of the list.

The invention may be embodied in many different forms and should not be construed as being limited to the embodiments set forth herein. In the drawing, the sizes and thicknesses of constituent elements are arbitrarily illustrated for convenience of description, and the present invention is not necessarily limited to the illustrations provided herein.

Hereinafter, the embodiments of the present invention will be described with reference to the attached drawings, and identical or corresponding elements will be labeled with like reference numerals and a description thereof may be omitted.

It will be understood that, although the terms "first," "second," etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

As used herein, the singular forms "a," "an," and "the," are intended to include the plural forms as well, unless the context clearly indicates otherwise.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on", "directly connected to", or "directly coupled to" another element or layer, there are no intervening elements or layers present. It will be further understood that the terms "comprises," "comprising," "includes," and/or "including," when used herein, specify the presence of stated features and/or components but do not preclude the presence or addition of one or more other features and/or components thereof.

According to the embodiments of the present invention below, when a layer, an area, or an element is referred to as being "on" another layer, area, or element, it may be placed above (e.g., at a higher position) or under (e.g., at a lower position) the other layer, area, or element, and it does not necessarily mean that the layer, area, or element has to be above or below the other layer, area, or element.

In the drawings, the sizes of components and/or layers may be exaggerated or reduced for convenience of description. For example, a size or thickness of a component is illustrated for convenience of description, and the embodiments of the present invention are not limited to the illustrated size.

An embodiment may be implemented in a different manner from that described herein. That is, a set or predetermined process order may be performed differently from that described herein. For example, two processes that are described to be performed concurrently may be performed at the same time in reality or in an opposite order than the described order.

Figure 2:
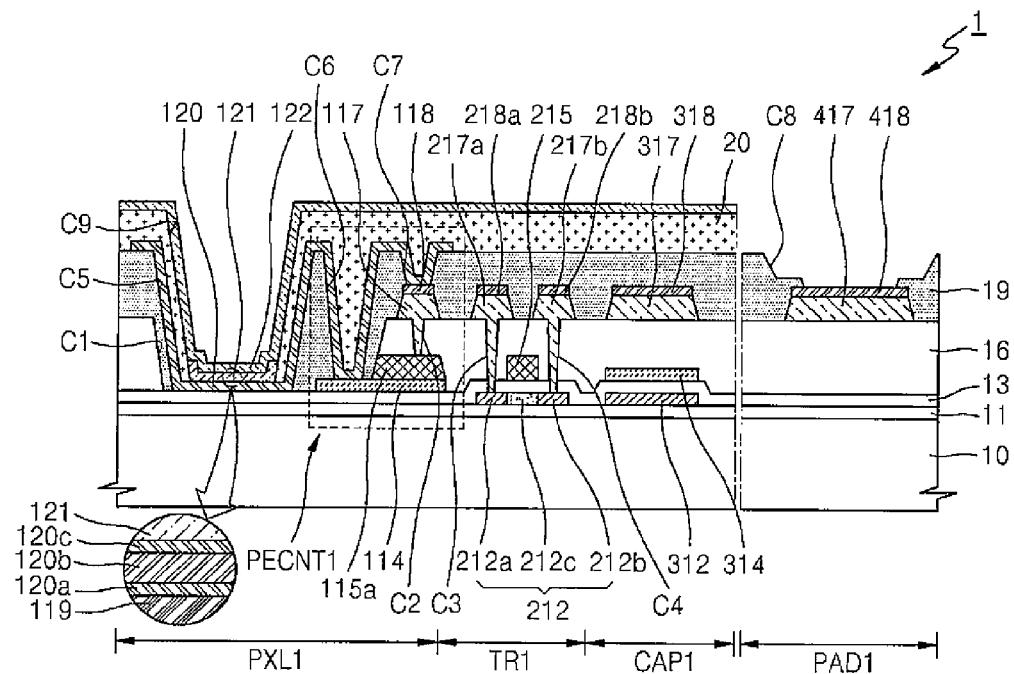
FIG. 2 is a schematic cross-sectional view illustrating a portion of a pixel and a pad of the organic light emitting display device shown in FIG. 1, according to an embodiment of the present invention.

FIG. 1 is a schematic plan view illustrating an organic light emitting display device 1 according to an embodiment of the present invention. FIG. 2 is a schematic cross-sectional view illustrating a portion of a pixel P and a pad PAD of the organic light emitting display device 1 shown in FIG. 1 according to an embodiment of the present invention.

Referring to FIG. 1, a display area DA including a plurality of pixels P to display an image (e.g., configured to display an image) is formed on a substrate 10 of the organic light emitting display device 1. The display area DA is formed within a sealing line SL (e.g., the sealing line SL surrounds a perimeter of the display area DA), and a sealing member that seals the display area DA is formed along the sealing line SL. A cathode contact portion that supplies power to a cathode that is commonly formed in the display area DA is formed between the display area DA and the pad PAD.

Referring to FIG. 2, a pixel area PXL1 including at least one organic emitting layer 121, a transistor area TR1 including at least one thin film transistor (TFT), a capacitor area CAP1 including at least one capacitor, and a pad area PAD1 are formed on the substrate 10.

In the transistor area TR1, an active layer 212 of a TFT is formed on the substrate 10 and a buffer layer 11.

The substrate 10 may be a transparent substrate, for example, a glass substrate or a plastic substrate including polyethylene terephthalate (PET), polyethylene naphthalate (PEN), a polyimide, or the like. However, the present invention is not limited to the materials listed herein.

The buffer layer 11 provides a planar surface on or above the substrate 10 and prevents or reduces penetration of impurity elements therethrough. The buffer layer 11 may be formed of a single layer or a plurality of layers formed of a silicon nitride (e.g., $Si_xN_y$) and/or a silicon oxide (e.g., $SiO_x$).

The active layer 212 is formed in the transistor area TR1 on the buffer layer 11. The active layer 212 may be formed of a semiconductor that includes, for example, amorphous silicon or crystalline silicon. The active layer 212 may include a channel area 212c, a source area 212a, and a drain area 212b. The source area 212a and the drain area 212b are respectively formed outside the channel area 212c and are each doped with ion impurities. The active layer 212 is not limited to amorphous silicon or crystalline silicon and may include, for example, an oxide semiconductor.

A gate electrode 215 is formed on the active layer 212 at a position corresponding to the channel area 212c of the active layer 212, while a first insulating layer 13 (e.g., a gate insulating layer) is included therebetween. The gate electrode 215 may be formed of a single layer or multiple layers formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 217a and a drain electrode 217b respectively contacting the source area 212a and the drain area 212b of the active layer 212 are formed on the gate electrode 215 while a second insulating layer 16 (e.g., an interlayer insulating layer) is included therebetween. The source electrode 217a and the drain electrode 217b may each include at least two layers formed of metals (e.g., heterogeneous metals) having different electron mobilities. For example, the source electrode 217a and the drain electrode 217b may each be formed of at least two layers formed of metals selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys thereof.

A third insulating layer 19 is formed on the second insulating layer 16 and covers the source electrode 217a and the drain electrode 217b.

The first insulating layer 13 and the second insulating layer 16 may be formed of a single layer or multiple inorganic insulating layers including, for example, silicon oxide (e.g., $SiO_2$), silicon nitride (e.g., $SiN_x$), silicon oxynitride (e.g., SiON), aluminum oxide (e.g., $Al_2O_3$), titanium oxide (e.g., $TiO_2$), tantalum pentoxide ($Ta_2O_5$), hafnium oxide (e.g., $HfO_2$), zirconium oxide (e.g., $ZrO_2$), barium strontium titanate (BST), lead zirconium titanate (PZT), or the like.

The third insulating layer 19 may be an organic insulating layer. The third insulating layer 19 may include, for example, general-use polymers such as poly(methyl methacrylate) (PMMA) or polystyrene (PS), a polymer derivative having a phenol group, an acrylic polymer, an imide based polymer, an aryl ether based polymer, an amide based polymer, a fluorine based polymer, a p-xylene based polymer, a vinyl alcohol polymer, or a blend of these.

A fourth insulating layer 20 is formed on the third insulating layer 19. The fourth insulating layer 20 may be an organic insulating layer. The fourth insulating layer 20 may be include, for example, general-use polymers such as PMMA or PS, a polymer derivative having a phenol group, an acrylic polymer, an imide based polymer, an aryl ether based polymer, an amide based polymer, a fluorine based polymer, a p-xylene based polymer, a vinyl alcohol polymer, or a blend of these.

The buffer layer 11, the first insulating layer 13, and a pixel electrode 120 are formed in the pixel area PXL1.

The pixel electrode 120 is formed in an opening C5 formed in the third insulating layer 19.

The opening C5, formed in the third insulating layer 19, is larger or wider than an opening C9 formed in the fourth insulating layer 20 and is smaller or narrower than an opening C1 formed in the second insulating layer 16, and the opening C1 formed in the second insulating layer 16, the opening C5 formed in the third insulating layer 19, and the opening C9 formed in the fourth insulating layer 20 overlap one another.

An end portion of the pixel electrode 120 is disposed on an upper end of the opening C5 formed in the third insulating layer 19 (e.g., is on the third insulating layer 19) and is covered by the fourth insulating layer 20. Meanwhile, an upper surface of the pixel electrode 120, disposed in the opening C5 formed in the third insulating layer 19, is exposed through the opening C9 formed in the fourth insulating layer 20.

The pixel electrode 120 includes a semi-transmissive metal layer 120b. Also, the pixel electrode 120 may further include transparent conductive oxide layers 120a and 120c that are formed under and over, respectively, the semi-transmissive metal layer 120b to protect the semi-transmissive metal layer 120b (i.e., the semi-transmissive metal layer 120b being between the transparent conductive oxide layers 120a and 120c).

The semi-transmissive metal layer 120b may be formed of, for example, silver (Ag) or a silver (Ag) alloy. The semi-transmissive metal layer 120b may have a micro-cavity structure with an opposite electrode 122 (e.g., a reflective electrode) to be further described later, thereby increasing light emission efficiency of the organic light emitting display device 1.

The transparent conductive oxide layers 120a and 120c may include at least one material selected from the group consisting of indium tin oxide (ITO), indium zinc oxide (IZO), zinc oxide (ZnO), indium oxide (e.g., $In_2O_3$), indium gallium oxide (IGO), and aluminum zinc oxide (AZO). The transparent conductive oxide layer 120a under the semi-transmissive metal layer 120b may reinforce a contacting force between the first insulating layer 13 and the pixel electrode 120 (e.g., may firmly adhere the pixel electrode 120 to the first insulating layer 13), and the transparent conductive oxide layer 120c on the semi-transmissive metal layer 120b may function as a barrier layer that protects the semi-transmissive metal layer 120b.

Meanwhile, when a metal such as silver, which is highly reductive and which is a material the semi-transmissive metal layer 120b may be formed of, receives electrons during an etching operation of patterning the pixel electrode 120, silver ions that exist as ions in an etchant may be reprecipitated as silver (Ag). The silver that is precipitated in this manner may cause particle defects that generate dark spots in subsequent processes for forming the pixel electrode 120.

When the source electrode 217a or the drain electrode 217b, a first contact layer 117 of a pixel electrode contact portion PECNT1, a first pad layer 417 of a pad electrode, or a data wiring formed of the same material as these is exposed to an etchant utilized in an operation of etching the pixel electrode 120 including silver, silver ions that are highly reductive may receive electrons from these metals to be reprecipitated as silver (Ag). For example, when these metals include molybdenum (Mo) or aluminum (Al), molybdenum may provide the electrons received from aluminum to the silver ions again so that the silver is reprecipitated. The reprecipitated silver particles may be a particle pollution source that causes defects such as dark spots in subsequent processes.

However, according to the organic light emitting display device 1 according to this embodiment of the present invention, the source electrode 217a and/or the drain electrode 217b is covered by the third insulating layer 19 which is an organic layer, and thus, the source electrode 217a or the drain electrode 217b is not exposed to an etchant including silver ions while the pixel electrode 120 including silver is being etched. Accordingly, particle defects due to reprecipitation of silver may be prevented or reduced.

Meanwhile, the first contact layer 117 and the first pad layer 417 are respectively disposed in areas exposed through a contact hole C7 and a contact hole C8 formed in the third insulating layer 19. A second contact layer 118 and a second pad layer 418, which are protection layers, are formed on the first contact layer 117 and the first pad layer 417, respectively, and thus, the first contact layer 117 and the first pad layer 417 are not exposed to an etchant while the pixel electrode 120 is etched. Accordingly, particle defects due to reprecipitation of silver may be prevented or reduced.

Also, according to this embodiment of the present invention, metal layers for forming the first contact layer 117, the source electrode 217a, the drain electrode 217b, a source electrode top layer 218a, a drain electrode top layer 218b, and the second pad layer 418 may be deposited (e.g., continuously deposited) and then patterned by using a single mask, thereby reducing the number of masks utilized.

The pixel electrode 120 is coupled to (e.g., connected to) the pixel electrode contact portion PECNT1 through the contact holes C6 and C7 formed in the third insulating layer 19. The pixel electrode contact portion PECNT1 is electrically coupled to (e.g., electrically connected to) the source electrode 217a or the drain electrode 217b of a driving transistor to drive the pixel electrode 120.

The pixel electrode contact portion PECNT1 includes the first contact layer 117 including the same material as that of the source electrode 217a and the drain electrode 217b described above, the second contact layer 118 including a transparent conductive oxide, a third contact layer 114 including a transparent conductive oxide, and a fourth contact layer 115a including the same material as that of the gate electrode 215.

The third contact layer 114 is exposed through the opening C1 formed in the second insulating layer 16 and the opening C6 formed in the third insulating layer 19. Accordingly, the pixel electrode 120 contacts the third contact layer 114 through the opening C6. Also, the third contact layer 114 contacts the fourth contact layer 115a, and the fourth contact layer 115a and the first contact layer 117 contact each other through a contact hole C2 formed in the second insulating layer 16, and the pixel electrode 120 contacts the first contact layer 117 through the opening C7 formed in the third insulating layer 19 and through the second contact layer 118.

That is, according to this embodiment of the present invention, in regards to a method of electrically coupling (e.g., electrically connecting) the pixel electrode 120 and a driving element, when they are coupled only through the contact hole C7 formed in the third insulating layer 19, that is, only through the first contact layer 117 and the second contact layer 118, the pixel electrode 120 (e.g., a semi-transmissive layer) is thin and step coverage may be poor (e.g., the pixel electrode 120 may not be completely formed in the contact hole C7), and thus the pixel electrode 120 may not be stably coupled to (e.g., connected to) an etching surface of the third insulating layer 19 or the contact hole C7. However, according to this embodiment of the present invention, even when a coupling (e.g., a connection) through the contact hole C7 formed in the third insulating layer 19 fails, the pixel electrode 120 may be coupled to (e.g., connected to) the third contact layer 114 through the contact hole C6 formed in the third insulating layer 19, and thus, a signal may be normally received from the driving element.

Meanwhile, the first contact layer 117 may be coupled to (e.g., connected to) a data line, and the data line may be electrically coupled to (e.g., electrically connected to) either the source electrode 217*a* or the drain electrode 217*b* of the driving transistor. When the transistor illustrated in FIG. 2 is the driving transistor, the first contact layer 117 may directly contact the source electrode 217*a* or the drain electrode 217*b* shown in FIG. 2.

An intermediate layer that includes an organic emitting layer 121 is formed on the pixel electrode 120. A top surface of the organic emitting layer 121 is exposed by the opening C9 formed in the fourth insulating layer 20. The organic emitting layer 121 may be a low-molecular organic material or a polymer organic material. When the organic emitting layer 121 is a low-molecular organic material, a hole transport layer (HTL), a hole injection layer (HIL), an electron transport layer (ETL), and an electron injection layer (EIL), or the like may be stacked in the organic emitting layer 121. In addition, other various suitable layers may be stacked as desired. Examples of organic materials that may be utilized include copper phthalocyanine (CuPc), NPB (N,N'-di(1-naphthyl)-N,N'-diphenylbenzidine), and Alq3 (tris(8-hydroxyquinolinato)aluminum). When the organic emitting layer 121 is a polymer organic material, an HTL may be included in the organic emitting layer 121. The HTL may be formed of PEDOT (poly(3,4-ethylenedihoxythiophene) or polyaniline (PANI). Examples of organic materials that may be used include PPV (poly-(p-phenylene vinylene))-based and polyfluorene-based polymer organic materials. Also, an inorganic material may be further included between the organic emitting layer 121 and the pixel electrode 120 and between the organic emitting layer 121 and the opposite electrode 122.

Although the organic emitting layer 121 is formed on a bottom of the opening C9 in FIG. 2, this is merely for convenience of description, and the embodiments of the present invention are not limited thereto. The organic emitting layer 121 may be formed not only on the bottom of the opening C9 but may also extend up to a top surface of the fourth insulating layer 20 along an etching surface of the opening C5 formed in the third insulating layer 19.

The opposite electrode 122 is formed on the organic emitting layer 121 and operates as a common electrode. In the organic light emitting display device 1 according to this embodiment of the present invention, the pixel electrode 120 operates as an anode, and the opposite electrode 122 operates as a cathode. However, polarities of the electrodes may be reversed.

The opposite electrode 122 may be a reflective electrode including a reflective material. The opposite electrode 122 may include at least one material selected from the group consisting of aluminum (Al), magnesium (Mg), lithium (Li), calcium (Ca), lithium fluoride/calcium (LiF/Ca), and lithium fluoride/aluminum (LiF/Al). When the opposite electrode 122 is formed as a reflective electrode, light emitted from the organic emitting layer 121 is reflected by the opposite electrode 121 to transmit through the pixel electrode 120 which is a semi-transmissive metal and is emitted toward the substrate 10.

The organic light emitting display device 1 according to this embodiment of the present invention is a bottom-emission display device in which light emitted from the organic emitting layer 121 is emitted toward the substrate 10 so as to form or display an image toward the substrate 10. Thus, the opposite electrode 122 is formed as a reflective electrode.

In the capacitor area CAP1, a capacitor including a first electrode 312 disposed on the same level as the active layer 212, a second electrode 314 disposed on the same level as the gate electrode 215, a third electrode 317 disposed on the same level as the source electrode 217*a* and the drain electrode 217*b*, and a third electrode top layer 318 disposed on the same level as the second contact layer 118 are each disposed on the substrate 10 and the buffer layer 11.

The first electrode 312 of the capacitor may be formed of a semiconductor doped with ion impurities, similar to the source area 212*a* and the drain area 212*b*.

While the second electrode 314 of the capacitor is disposed on the first insulating layer 13, similar to the gate electrode 215, the second electrode 314 and the first insulating layer 13 are formed of different materials. The second electrode 314 may include a transparent conductive oxide. By forming the first electrode 312 as a semiconductor doped with ion impurities, the capacitor having a metal-insulator-metal (MIM) structure may be formed.

The third electrode 317 of the capacitor may be formed of the same material as that of the source electrode 217*a* and the drain electrode 217*b*. As described above, the third electrode 317 is covered by the third insulating layer 19, which is an organic layer, while the pixel electrode 120 including silver (Ag) is etched. Therefore, the third electrode 317 is not exposed to an etchant that includes silver (Ag) ions. Accordingly, particle defects due to reprecipitation of silver (Ag) may be prevented. In addition, because the capacitor includes the first and second electrodes 312 and 314, capacitance of the organic light emitting display device may be increased without an increase in a surface area of the capacitor. Accordingly, the surface area of the capacitor may be reduced without significantly affecting the capacitance thereof and an aperture ratio may be increased.

In addition, the third electrode top layer 318 of the capacitor may be formed of a transparent conductive oxide including at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). As described above, the third electrode top layer 318 may be patterned by using the same mask used to form (or when forming) the third electrode 317, and thus, the number of masks may be reduced.

In an outer portion of the display area DA, the pad area PAD1 is formed. The first pad layer 417, which acts as a connection terminal for an external driver is disposed in the pad area PAD1.

Similar to the source electrode 217*a* and the drain electrode 217*b*, the first pad layer 417 may include multiple metal layers having different electron mobilities as described above. For example, the first pad layer 417 may be formed of multiple layers formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second pad layer 418 may be formed of a transparent conductive oxide including at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The second pad layer 418 protects the first pad layer 417 from being exposed to water or oxygen, thereby preventing or reducing a decrease in reliability of the pad PAD.

As described above, although the first pad layer 417 is disposed at an area exposed through the contact hole C8 formed in the third insulating layer 19, the second pad layer 418, which is a protection layer, is formed on or over the first pad layer 417 such that the first pad layer 417 is not exposed to an etchant while the pixel electrode 120 is etched.

Furthermore, because an end portion of the first pad layer 417, which is sensitive to an external environment including water or oxygen, is covered by the third insulating layer 19, the end portion of the first pad layer 417 is also not exposed to the etchant while the pixel electrode 120 is etched.

Meanwhile, because the second pad layer 418, which is a protection layer, is formed on the first pad layer 417, the first pad layer 417 is not exposed to the etchant during an etching operation of the pixel electrode 120, but the second pad layer 418 may be exposed to the etchant during the etching operation. For example, when the second pad layer 418 includes at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO), the etchant and the second pad layer 418 may react with each other.

When the etchant and the second pad layer 418 react, the second pad layer 418, which functions as a protection layer of the first pad layer 417, is damaged, and the first pad layer 417 may be exposed (e.g., exposed to the etchant) to cause dark spot defects where silver (Ag) reprecipitates as described above. Accordingly, to prevent the second pad layer 418 from reacting with the etchant, the second pad layer 418 may also be protected while the pixel electrode 120 is etched.

According to this embodiment of the present invention, the third insulating layer 19 is patterned by using a half-tone mask such that a remaining layer (e.g., a thinner portion) of the third insulating layer 19 having a thickness (e.g., a predetermined thickness) is formed in the pad area PAD1, and thus, the second pad layer 418 is not exposed (e.g., is not exposed to the etchant) during etching of the pixel electrode 120. Accordingly, reactivity of silver (Ag) particles is controlled or prevented, thereby significantly reducing dark spot defects due to the silver (Ag) particles. Here, a thickness of the remaining layer of the third insulating layer 19 located in the pad area PAD1 for protection of the second pad layer 418 may be in a range from about 3,000 Å to about 10,000 Å.

Thus, particle defects due to reprecipitation of silver (Ag) may be prevented or reduced, and a decrease in reliability of the pad electrode may also be prevented.

Meanwhile, the organic light emitting display device 1 according to this embodiment of the present invention may further include a sealing member that seals the display area DA including the pixel area PXL1, the capacitor area CAP1, and the transistor area TR1. The sealing member may be formed of a substrate including, for example, a glass material, a metal film, or a sealing thin film in which an organic insulating layer and an inorganic insulating layer are alternately arranged.

Hereinafter, a method of manufacturing the organic light emitting display device 1 according to an embodiment of the present invention will be described with reference to FIGS. 3A through 3I.

Figure 3A:
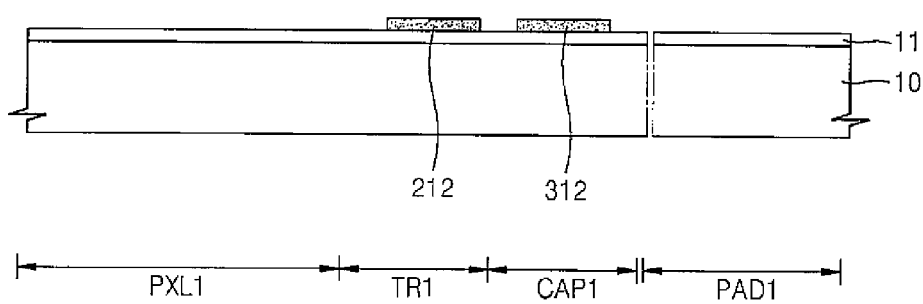
FIGS. 3A through 3I are schematic views illustrating a method of manufacturing an organic light emitting display device according to an embodiment of the present invention.

FIG. 3A is a schematic cross-sectional view illustrating a first mask operation of the organic light emitting display device 1 according to this embodiment of the present invention.

Referring to FIG. 3A, a buffer layer 11 is formed on a substrate 10, a semiconductor layer is formed on the buffer layer 11, and the semiconductor layer is patterned to form an active layer 212 of a TFT and a first electrode 312 of a capacitor.

A photoresist material may be coated on a semiconductor layer, and then the semiconductor layer may be patterned by utilizing, for example, a photolithography operation by using a first photo-mask, thereby forming the active layer 212 and the first electrode 312 described above. The first mask operation, utilizing photolithography, may be performed by a series of operations such as exposing the first photo-mask by utilizing an exposure device, developing, etching, stripping, and ashing.

The semiconductor layer may be formed, for example, of amorphous silicon or crystalline silicon. The crystalline silicon may be formed by crystallizing the amorphous silicon. Examples of methods of crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. However, the semiconductor layer is not limited to amorphous or crystalline silicon and may include an oxide semiconductor or a compound semiconductor.

Figure 3B:
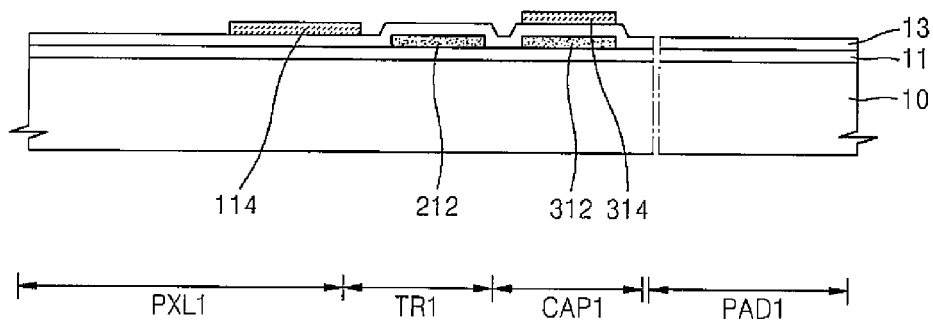

FIG. 3B is a schematic cross-sectional view illustrating a second mask operation of the organic light emitting display device 1 according to this embodiment of the present invention.

A first insulating layer 13 is formed on a resultant product of the first mask operation illustrated in FIG. 3A, and a transparent conductive oxide layer is formed on the first insulating layer 13 and is patterned.

The transparent conductive oxide layer may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

As a result of patterning, a third contact layer 114 of a pixel electrode contact portion and a second electrode 314 of the capacitor are formed on the first insulating layer 13.

Figure 3C:
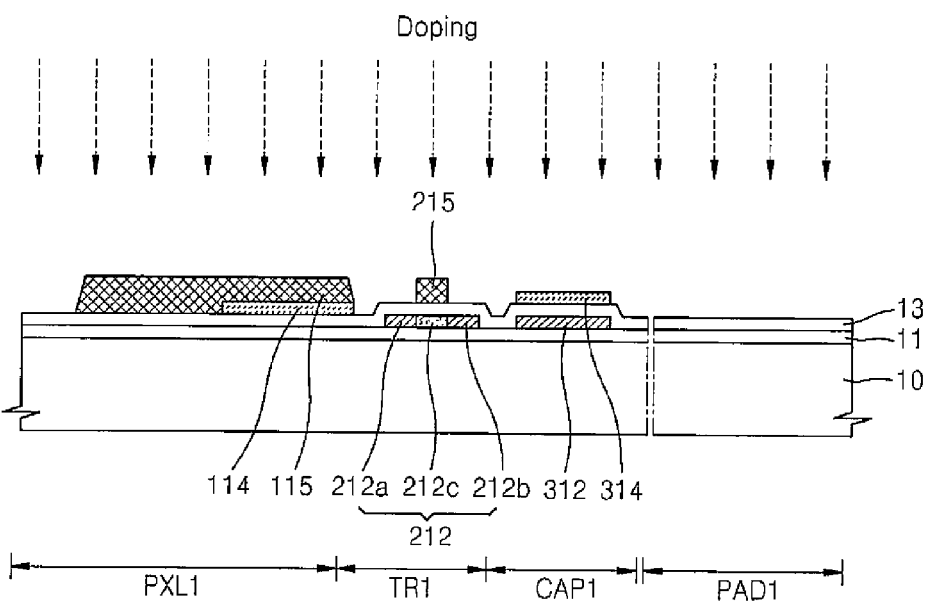

FIG. 3C is a schematic cross-sectional view illustrating a third mask operation of the organic light emitting display device 1 according to this embodiment of the present invention.

A first metal layer is stacked on a resultant product of the second mask operation illustrated in FIG. 3B and is patterned. As described above, the first metal layer may be formed of a single layer or multiple layers formed of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of patterning, a gate electrode 215 and a gate metal layer 115 that covers at least a surface of the third contact layer 114 are formed on the first insulating layer 13.

Ion impurities are doped on the structure as described above. As the ion impurities may be N-type or P-type ions, and the active layer 212 of the TFT and the first electrode 312 of the capacitor may be doped with the ion impurities at a density of about $1 \times 1015$ atoms/cm$^2$ or higher.

By doping the active layer 212 with the ion impurities by utilizing the gate electrode 215 as a self-aligning mask, the active layer 212 includes a source area 212a and a drain area 212b that are doped with ion impurities and a channel area 212c that is not doped with ion impurities. Here, the first electrode 312 of the capacitor is also doped with ion impurities and is used as an electrode that forms a metal-insulator-metal (MIM) capacitor structure.

Accordingly, by performing a single doping operation, not only is the active layer 212 doped but the first electrode 312 is also doped at the same time, thereby reducing the manufacturing costs by reducing the number of doping operations.

Figure 3D:
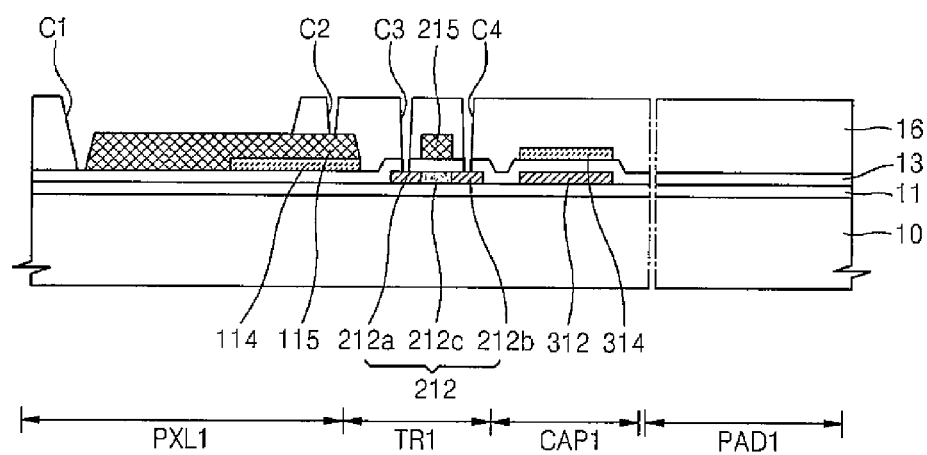

FIG. 3D is a schematic cross-sectional view illustrating a result of a fourth mask operation of the organic light emitting display device 1 according to this embodiment of the present invention.

Referring to FIG. 3D, a second insulating layer 16 is formed on a resultant product of the third mask operation illustrated in FIG. 3C, and the second insulating layer 16 is patterned to form openings C3 and C4 that expose the source area 212a and the drain area 212b of the active layer 212, respectively, an opening C1 in an area spaced from (e.g., separated from) the active layer 212, in which the pixel electrode 120 to be further described below is to be formed, and an opening C2 that exposes at least a portion of the gate metal layer 115.

Figure 3E:
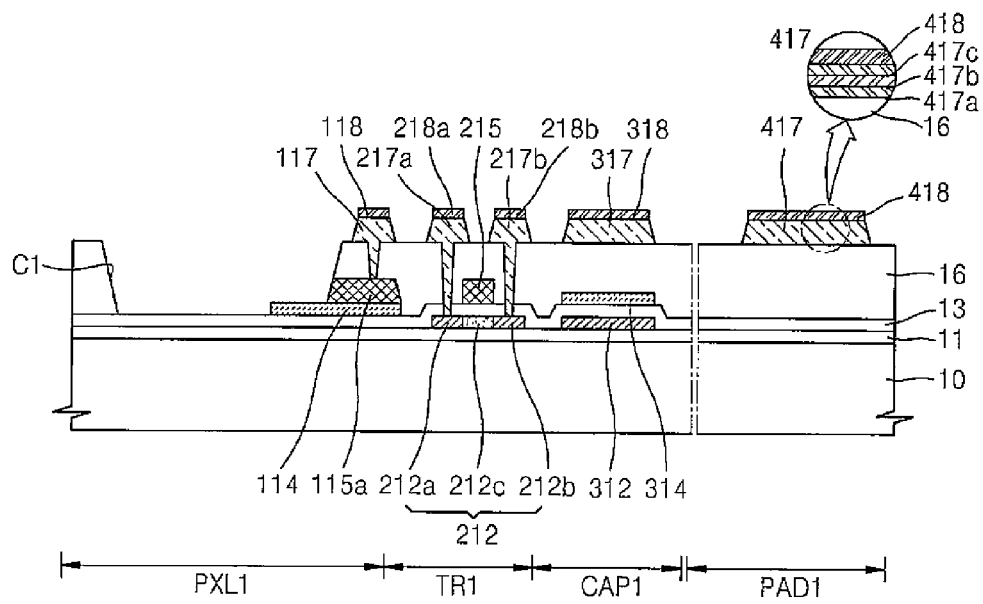

FIG. 3E is a schematic cross-sectional view illustrating a result of a fifth mask operation of the organic light emitting display device 1 according to this embodiment of the present invention.

Referring to FIG. 3E, a second metal layer and a transparent conductive oxide layer are formed (e.g., continuously formed) on the resultant product of the fourth mask operation illustrated in FIG. 3D, and the second metal layer and the transparent conductive oxide layer are patterned using a single mask. The second metal layer is patterned to form (e.g., to concurrently form) a source electrode 217a, a drain electrode 217b, a first contact layer 117 of the pixel electrode contact portion, a third electrode 317 of the capacitor, and a first pad layer 417 of a pad electrode. Also, the transparent conductive oxide layer is patterned to form a second contact layer 118, a source electrode top layer 218a, a drain electrode top layer 218b, a third electrode top layer 318 of the capacitor, and a second pad layer 418 of the pad electrode.

According to this embodiment of the present invention, the second metal layer and the transparent conductive oxide layer are deposited (e.g., continuously deposited) during the fifth mask operation and then are patterned by utilizing a single mask, thereby protecting the first contact layer 117 and the first pad layer 417 from an etchant and reducing the number of masks at the same time.

The second metal layer may include at least two metal layers (e.g., two heterogeneous metal layers) having different electron mobilities. For example, the second metal layer may include at least two metal layers selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys thereof.

Referring to FIG. 3E, to illustrate a detailed structure of the second metal layer, the first pad layer 417 is illustrated in further detail. For example, the second metal layer may include a first layer 417a including molybdenum (Mo), a second layer 417b including aluminum (Al), and a third layer 417c including molybdenum (Mo).

The second layer 417b, including aluminum (Al), may be a metal layer having a relatively low resistance and relatively high electrical conductance, the first layer 417a (that is formed under the second layer 417b and includes molybdenum (Mo)) may form a strong adhesive force (e.g., may reinforce an adhesive force) with respect to the second insulating layer 16, and the third layer 417c (that is formed on the second layer 417b and includes molybdenum (Mo)) may function as a barrier layer that prevents heel lock of aluminum (Al) included in the second layer 417b and oxidization and/or diffusion thereof.

The transparent conductive oxide layer including at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO) may be used. The second pad layer 418 formed by patterning the transparent conductive oxide layer may protect a top surface of the first pad layer 417 from an etchant.

Meanwhile, a data wiring may also be formed by patterning the second metal layer during the fifth mask operation.

Figure 3F:
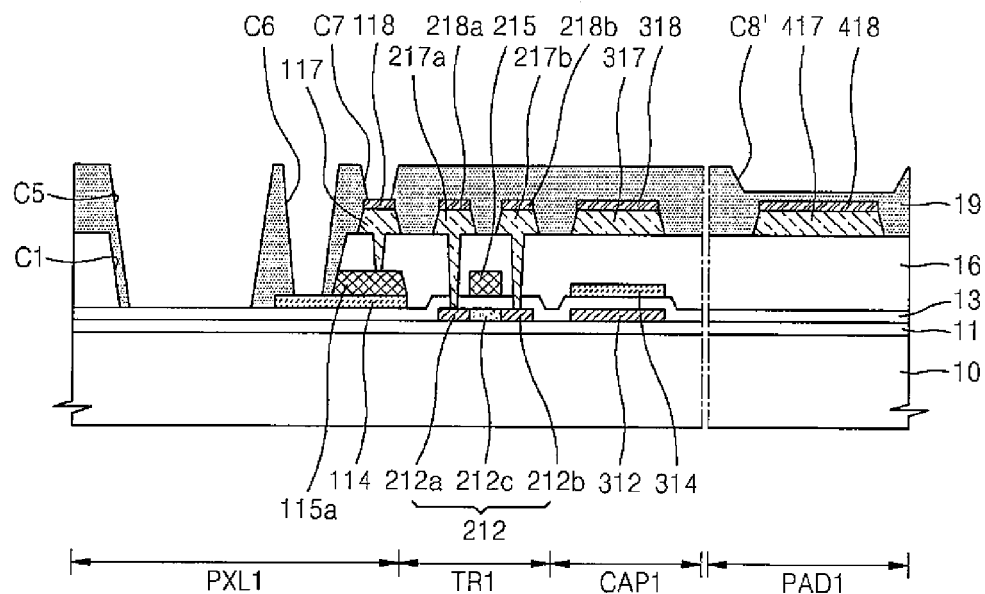

FIG. 3F is a schematic cross-sectional view illustrating a result of a sixth mask operation of the organic light emitting display device 1 according to this embodiment of the present invention.

Referring to FIG. 3F, a third insulating layer 19 is formed on a resultant product of the fifth mask operation illustrated in FIG. 3E, and the third insulating layer 19 is patterned to form a contact hole C6 that exposes an upper portion of the third contact layer 114, a contact hole C7 that exposes an upper portion of the second contact layer 118 of the pixel electrode contact portion, a thinner portion C8' (e.g., a half hole) formed at an upper portion of the second pad layer 418, and an opening C5 in the pixel area PXL1 in which the pixel electrode 120, to be further described below, is to be formed.

The third insulating layer 19 is formed to surround (e.g., completely surround or encapsulate) the source electrode 217a and the drain electrode 217b so as to prevent heterogeneous wirings having a potential difference from contacting an etchant in which silver (Ag) ions are dissolved when the pixel electrode 120 including silver (Ag), which will be further described below, is etched.

The third insulating layer 19 may be formed of an organic insulating layer and may function as a planarization layer. Examples of the organic layer include general-use polymers (e.g., PMMA or PS), a polymer derivative having a phenol group, an acrylic polymer, an imide based polymer, an aryl ether based polymer, an amide based polymer, a fluorine based polymer, a p-xylene based polymer, a vinyl alcohol polymer, or a blend of these.

The opening C5 formed in the third insulating layer 19 and the opening C1 formed in the second insulating layer 16 overlap, and the opening C5 formed in the third insulating layer 19 is formed to be smaller than the opening C1 formed in the second insulating layer 16.

Meanwhile, according to this embodiment of the present invention, the sixth mask operation illustrated in FIG. 3F may be an operation that utilizes a half-tone mask. When a half-tone mask is utilized, a patterning thickness of a layer that is being patterned may be adjusted. Referring to a result of the operation illustrated in FIG. 3F, the third insulating layer 19 may not be completely patterned at the second pad layer 418 but a portion of the third insulating layer 19 having a thickness (e.g., a predetermined thickness) may remain on the second pad layer 418. For example, the half-tone mask is utilized to pattern the third insulating layer 19 to form the thinner portion C8', but the second pad layer 418 is not exposed.

A remaining layer of the third insulating layer 19 formed at the thinner portion C8' protects the second pad layer 418 by preventing the second pad layer 418 from being exposed to an etchant while the pixel electrode 120 is patterned. According to this embodiment of the present invention, in order to form the remaining layer of the third insulating layer 19 illustrated in FIG. 3F, a half-tone mask is utilized, and the openings C5, C6, and C7 are portions corresponding to a light transmitting portion of the half-tone mask, and the thinner portion C8' may be a portion corresponding to a semi-transmissive portion of the half-tone mask.

Figure 3G:
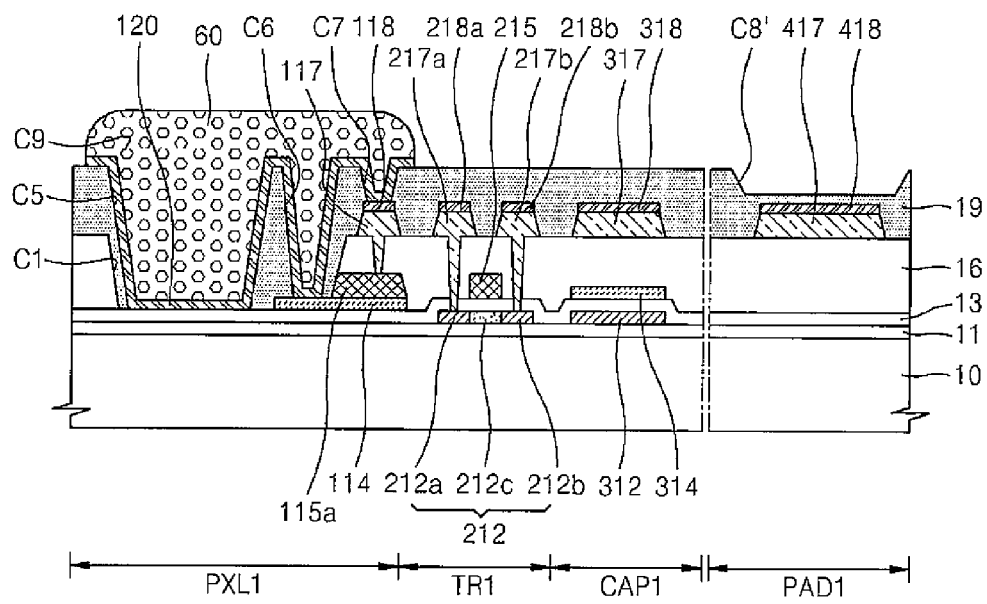
Figure 3H:
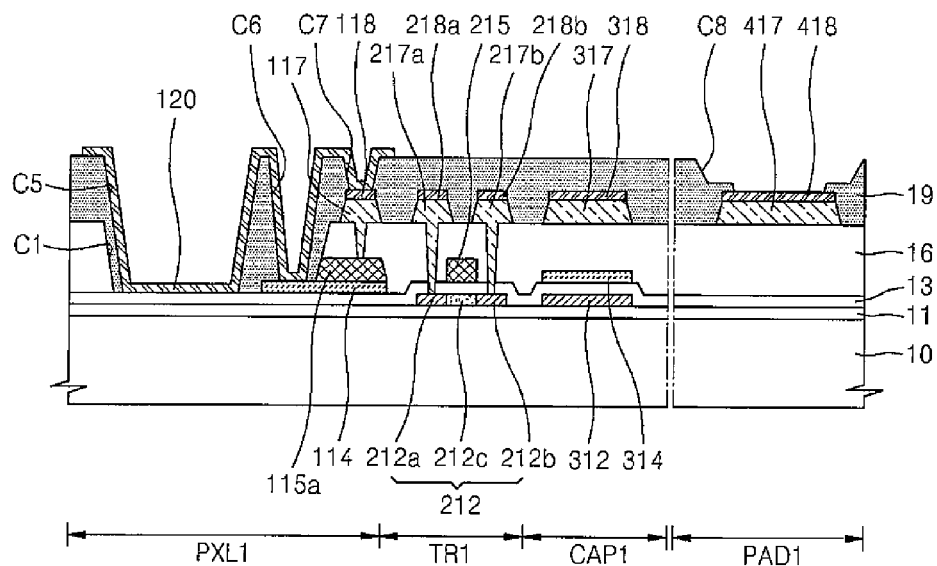

FIGS. 3G and 3H are schematic cross-sectional views illustrating a result of a seventh mask operation of the organic light emitting display device 1 according to this embodiment of the present invention.

Referring to FIG. 3G, a semi-transmissive metal layer may be formed on a resultant product of the sixth mask operation illustrated in FIG. 3F, and a photoresist material may be coated to pattern the semi-transmissive metal layer. The photoresist material may be a photosensitive polymer and includes a material that reacts to light. Examples of the photoresist material include a solvent, a hydrocarbon polymer, and a sensitizer (e.g., a photoactive compound (PAC)).

The photoresist material may be classified as two types, namely, a negative photoresist material, in which a portion thereof that is exposed to light solidifies and the other portion melts, and a positive photoresist material, in which a portion exposed to light melts. After being coated, the photoresist material is exposed by utilizing an exposure device such as a stepper during a mask operation in which a seventh mask is utilized. Then, when a positive phororesist is used, the positive photoresist that is photo-sensitized may be developed so as to form a photoresist layer 60 having a pattern according to a portion that may not correspond to an opening in the seventh mask. When a negative type photoresist is used, the photo-sensitized photoresist is developed to form a photoresist layer 60 having a pattern according to the opening portion in the seventh mask. The seventh mask is utilized to form the pixel electrode 120, and thus, the seventh mask is above a portion where the pixel electrode 120 is to be formed. That is, the photoresist layer 60 may be present up to an area where the opening C5 of the pixel area PXL1 and the openings C6 and C7 of the pixel electrode contact portions PECNT1 are covered.

Next, the pixel electrode 120 is formed by etching the semi-transmissive metal layer by utilizing the remaining photoresist layer 60 as a mask. A material that is exposed in the operation illustrated in FIG. 3G may be influenced by an etchant that is used when etching the pixel electrode 120. Accordingly, according to this embodiment of the present invention, in order to prevent the second pad layer 418 from being exposed to the etchant, a half-tone mask is used when performing the sixth mask operation to form a remaining layer (e.g., a thinner portion) of the third insulating layer 19 at the pad area PAD1.

Next, the second pad layer 418 is exposed by removing the remaining portion (e.g., the thinner portion) of the third insulating layer 16 at the pad area PAD1 when the photoresist layer 60 on the pixel electrode 120 is also removed as illustrated in FIG. 3H.

According to this embodiment of the present invention, etching is performed by utilizing the photoresist layer 60 as a mask, and the photoresist layer 60 is removed by ashing and stripping. Here, the remaining layer of the third insulating layer 19 on the second pad layer 418 may be removed using the ashing operation. The ashing and stripping operations may also be referred to as an exfoliating operation, in which a photoresist that is coated for forming a pattern in a photo-process is etched and then a remaining layer of the photoresist is peeled off or removed. For example, during the ashing operation, the remaining photoresist layer 60 may be removed by utilizing an oxygen plasma utilizing $O_2$. Because the photoresist includes a hydrocarbon polymer, oxygen atoms may quickly react with a photoresist to generate carbon monoxide (CO), carbon dioxide ($CO_2$), and water ($H_2O$) that are volatile and may thus be easily removed. Meanwhile, the stripping operation is an operation during which the photoresist layer 60 is removed by utilizing sulfuric acid ($H_2SO_4$) or hydrogen peroxide ($H_2O_2$).

As a result of the seventh mask operation, the pixel electrode 120 is coupled to (e.g., connects to) a driving transistor via the pixel electrode contact portion PECNT1 and is disposed in the openings C5, C6, and C7 formed in the third insulating layer 19. Also, the second pad layer 418 is exposed.

The pixel electrode 120 includes a semi-transmissive metal layer 120b. Also, the pixel electrode 120 may further include transparent conductive oxide layers 120a and 120c that are respectively formed under and above the semi-transmissive metal layer 120b to protect the semi-transmissive metal layer 120b.

The semi-transmissive metal layer 120b may be formed of silver (Ag) or a silver (Ag) alloy. The transparent conductive oxide layers 120a and 120c that include a transparent conductive oxide may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The semi-transmissive metal layer 120b may form a micro-cavity structure with an opposite electrode 122, which is a reflective electrode to be further described later, thereby increasing light emission efficiency of the organic light emitting display device 1.

When a metal such as silver (Ag), which is highly reductive and which is a material the semi-transmissive metal layer 120b is formed of, receives electrons during an etching operation of patterning the pixel electrode 120, silver (Ag) ions that exist as ions in an etchant may be reprecipitated as silver (Ag). During an etching operation of the pixel electrode 120 including silver (Ag), when the source electrode 217a, the drain electrode 217b, the first contact layer 117 of the pixel electrode contact portion, the first pad layer 417, or the data wiring that is formed of the same materials as the above elements is exposed to an etchant, silver (Ag) ions which are highly reductive may receive electrons from these metals to be reprecipitated as silver (Ag).

However, in the organic light emitting display device 1 according to this embodiment of the present invention, the source electrode 217a and/or the drain electrode 217b is covered by the third insulating layer 19 which is an organic layer, and thus, the source electrode 217a and/or the drain electrode 217b is not exposed to an etchant including silver (Ag) ions while the pixel electrode 120 including silver (Ag) is etched. Accordingly, particle defects due to reprecipitation of silver (Ag) may be prevented or reduced.

Also, although the first contact layer 117 of the pixel electrode contact portion and the first pad layer 417 are respectively disposed in areas exposed through the contact hole C7 and the contact hole C8 formed in the third insulating layer 19 in this embodiment of the present invention, because the second contact layer 118 of the pixel electrode contact portion and the second pad layer 418, which are protection layers, are formed on the first contact layer 117 of the pixel electrode contact portion and the first pad layer 417, respectively, the first contact layer 117 of the pixel electrode contact portion and the first pad layer 417 are not exposed to an etchant while the pixel electrode 120 is etched. Accordingly, particle defects due to reprecipitation of silver (Ag) may be prevented or reduced.

In addition, according to this embodiment of the present invention, a haltone mask is used to form a remaining layer of the third insulating layer 19 in order to protect the second pad layer 418 of the pad area PAD1, and thus, during the patterning operation of the pixel electrode 120, the second pad layer 418 is not exposed to an etchant, thereby preventing or reducing particle defects.

Figure 3I:
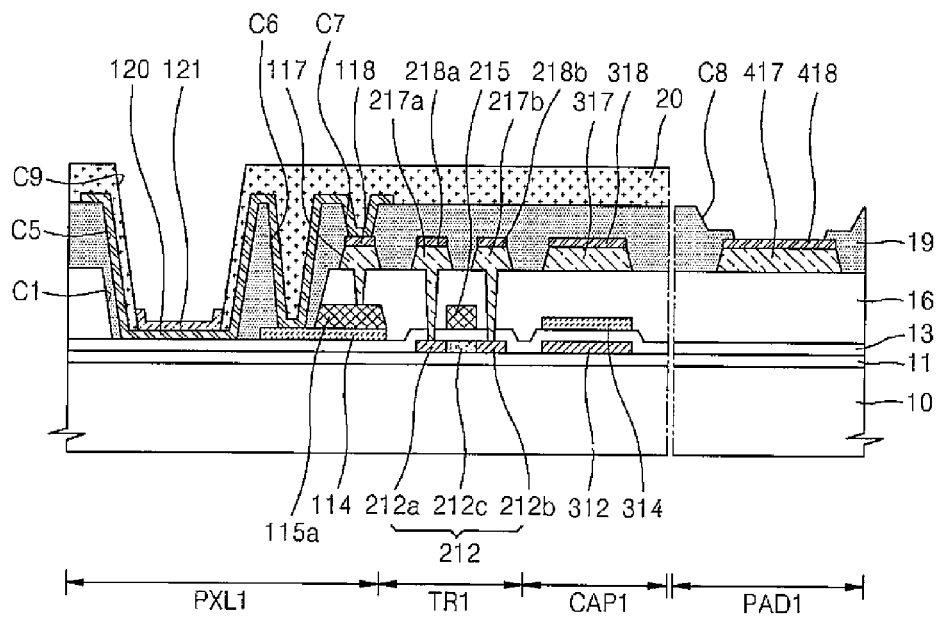

FIG. 3I is a schematic cross-sectional view illustrating a result of an eighth mask operation of the organic light emitting display device 1 according to this embodiment of the present invention.

Referring to FIG. 3I, an eighth mask operation (of forming a fourth insulating layer 20 on a resultant product of the seventh operation illustrated in FIG. 3H and an opening C9 that exposes an upper portion of the pixel electrode 120) is performed.

The fourth insulating layer 20 functions as a pixel definition layer and may be formed of an organic insulating layer, such as general-use polymers (e.g., PMMA or PS), a polymer derivative having a phenol group, an acrylic polymer, an imide based polymer, an aryl ether based polymer, an amide based polymer, a fluorine based polymer, a p-xylene based polymer, a vinyl alcohol polymer, or a blend of these.

An intermediate layer including the organic emitting layer 121 (see FIG. 2) is formed on a resultant product of the eighth mask operation illustrated in FIG. 3I, and then an opposite electrode 122 (see FIG. 2) is formed.

According to the organic light emitting display device 1 and the method of manufacturing the same described above, because the pixel electrode 120 includes the semi-transmissive metal layer 120b, light emission efficiency of the organic light emitting display device 1 may be improved due to the micro-cavity structure.

In addition, because the source electrode 217a and/or the drain electrode 217b are not exposed to an etchant including silver (Ag) ions due to a structure in which the source electrode 217a and/or the drain electrode 217b are covered by the third insulating layer 19, which is an organic layer, particle defects due to reprecipitation of silver (Ag) may be prevented.

In addition, the second contact layer 118 of the pixel electrode contact portion and the second pad layer 418, which are protection layers, are respectively formed on the first contact layer 117 of the pixel electrode contact portion and the first pad layer 417 so that the first contact layer 117 and the first pad layer 417 are not exposed to an etchant, thereby preventing or reducing particle defects due to reprecipitation of silver (Ag). Here, the first contact layer 117, the first pad layer 417, the second contact layer 18, and the second pad layer 418 may be concurrently or simultaneously formed, thereby reducing the number of masks.

In addition, when patterning the pixel electrode 120, a remaining layer of the third insulating layer 19 may remain on the second pad layer 418 of the pad area PAD1 by utilizing a half-tone mask, thereby protecting the second pad layer 418 from the etchant. The remaining layer of the third insulating layer 19 may have a thickness in a range of about 3,000 Å to about 10,000 Å.

An organic light emitting display device 2 according to a comparative example will be described below with reference to FIG. 4.

Hereinafter, like reference numerals denote like elements. In addition, the following description will focus on differences from the organic light emitting display device 1 described above.

Figure 4:
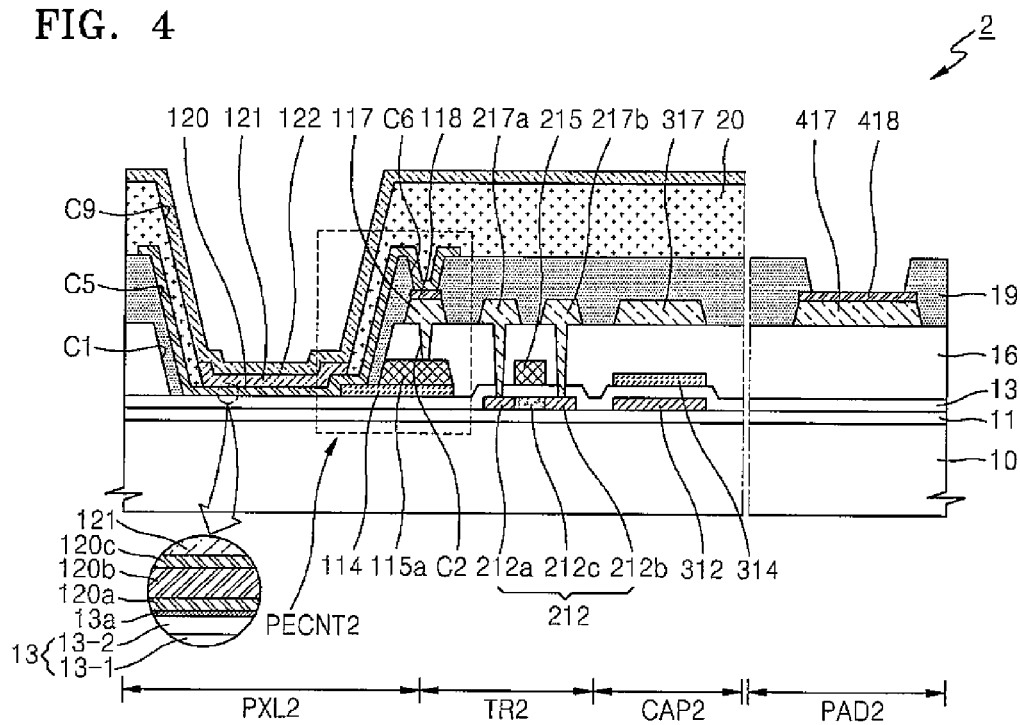
FIG. 4 is a schematic plan view illustrating an organic light emitting display device according to a comparative example.

Referring to FIG. 4, a pixel area PXL2 including at least one organic emitting layer 121, a transistor area TR2 including at least one thin film transistor (TFT), a capacitor area CAP2 including at least one capacitor, a pixel electrode contact portion PECNT2, and a pad area PAD2 are formed on a substrate 10.

The transistor area TR2 and the capacitor area CAP2 according to the comparative example do not include a source electrode top layer 218a, a drain electrode top layer 218b, and a third electrode top layer 318, and these layers 218a, 218b, and 310, in the previous example embodiment, included a transparent conductive oxide. According to the comparative example, an additional mask is needed to form a second contact layer 118 and a second pad layer 418 compared to the previously described example embodiment.

The pixel electrode 120 includes a semi-transmissive metal layer 120b including silver (Ag) or a silver (Ag) alloy and transparent conductive oxide layers 120a and 120c that are respectively formed under and above the semi-transmissive metal layer 120b to protect the semi-transmissive metal layer 120b.

Hereinafter, a method of manufacturing the organic light emitting display device 2 according to the comparative example will be described with reference to FIGS. 5A through 5I.

Figure 5A:
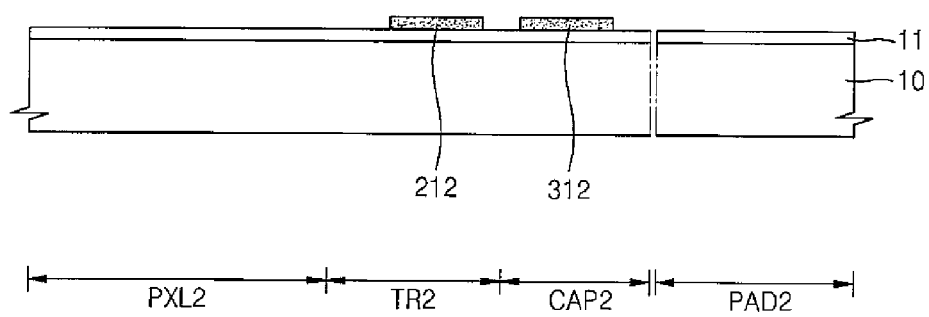
FIGS. 5A through 5I are schematic views illustrating a method of manufacturing an organic light emitting display device according to the comparative example.

FIG. 5A is a schematic cross-sectional view illustrating a first mask operation of the organic light emitting display device 2 according to the comparative example.

An active layer 212 of a TFT and a first electrode 312 of a capacitor are formed on the substrate 10.

Figure 5B:
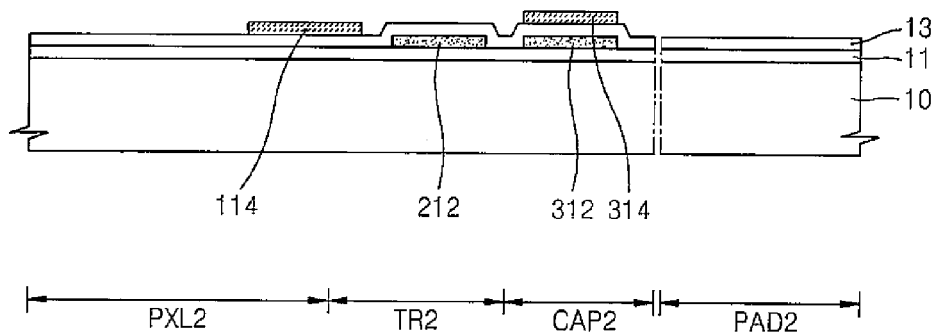

FIG. 5B is a schematic cross-sectional view illustrating a second mask operation of the organic light emitting display device 2 according to the comparative example.

A third contact layer 114 of a pixel electrode contact portion and a second electrode 314 of the capacitor are formed on a first insulating layer 13.

Figure 5C:
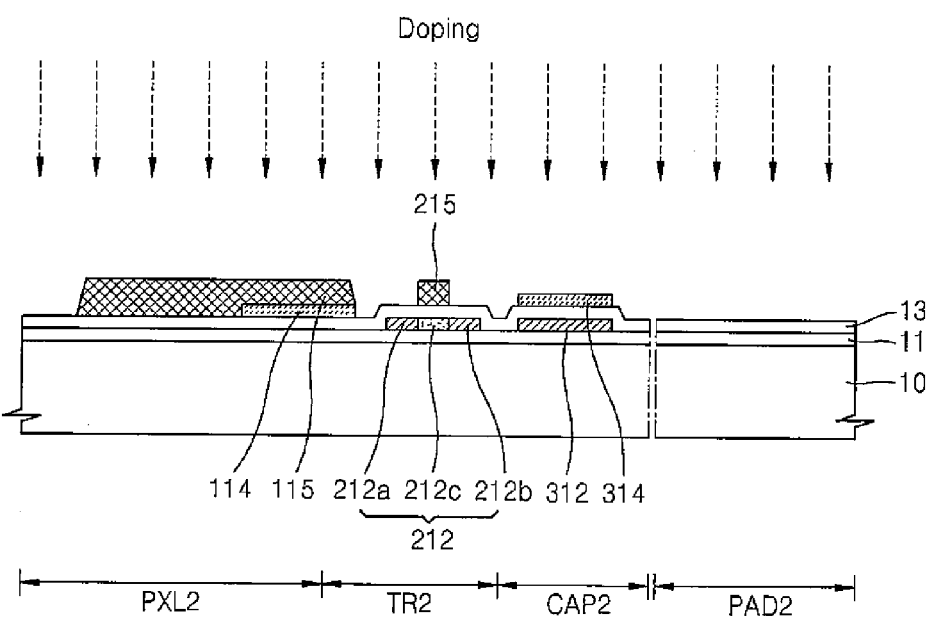

FIG. 5C is a schematic cross-sectional view illustrating a third mask operation of the organic light emitting display device 2 according to the comparative example.

A gate electrode 215 and a gate metal layer 115 that covers the third contact layer 114 are formed on the first insulating layer 13.

Figure 5D:
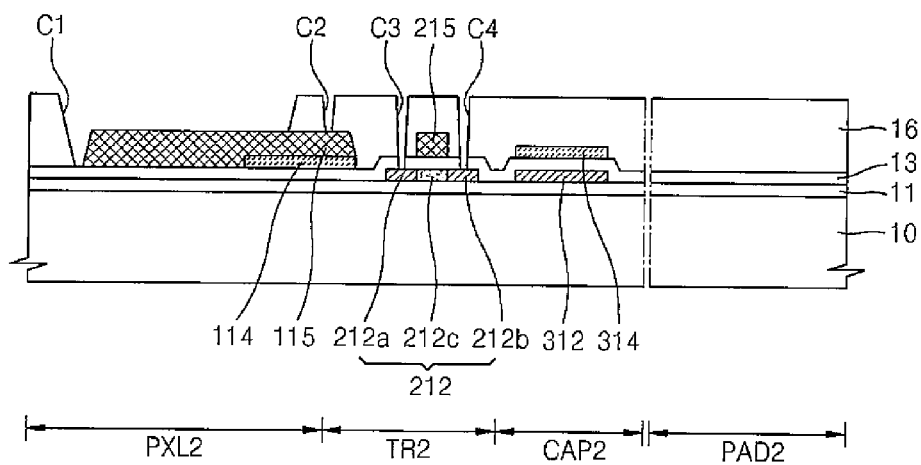

FIG. 5D is a schematic cross-sectional view illustrating a result of a fourth mask operation of the organic light emitting display device 2 according to the comparative example.

Here, openings C3 and C4 that expose a source area 212a and a drain area 212b of the active layer 212 are formed, and an opening C1, in which the pixel electrode 120 is to be disposed, is formed such that it is spaced from (e.g., separated from) the active layer 212.

Figure 5E:
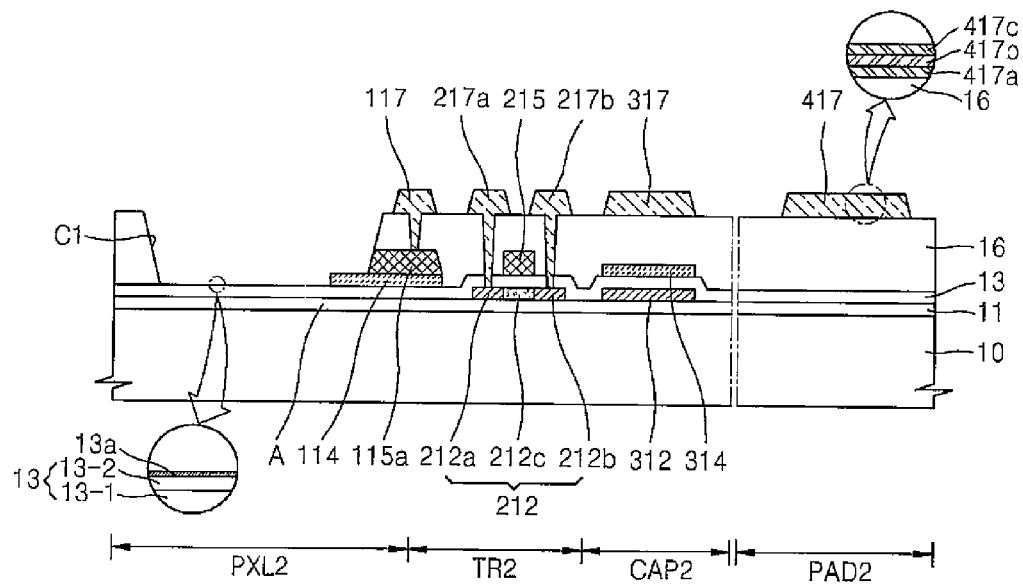

FIG. 5E is a schematic cross-sectional view illustrating a result of a fifth mask operation of the organic light emitting display device 2 according to the comparative example.

Referring to FIG. 5E, a second metal layer is formed on a result of the fourth mask operation of FIG. 5D, and the second metal layer is patterned to concurrently or simultaneously form a source electrode 217a and a drain electrode 217b, a first contact layer 117 of the pixel electrode contact portion, and a first pad layer 417 of the pad electrode.

When patterning the second metal layer, a gate metal layer 115 formed on the first insulating layer 13 of the opening C1 is removed by etching.

Figure 5F:
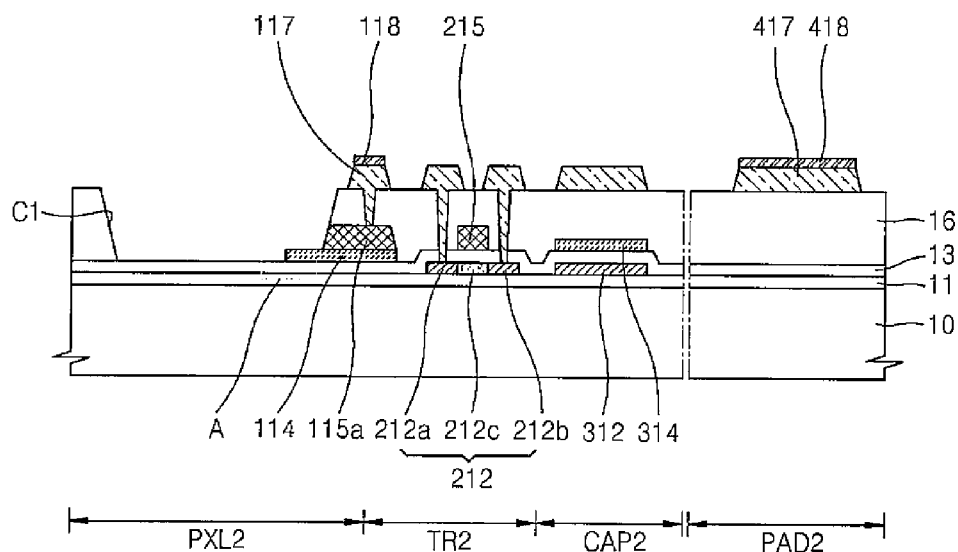

FIG. 5F is a schematic cross-sectional view illustrating a result of a sixth mask operation of the organic light emitting display device 2 according to the comparative example.

Referring to FIG. 5F, a transparent conductive oxide layer is formed on a resultant product of the fifth mask operation illustrated in FIG. 5E, and the transparent conductive oxide layer is patterned to form a second contact layer 118 of a pixel electrode contact portion and a second pad layer 418 of a pad electrode. Because an additional mask is needed to pattern the transparent conductive oxide layer of the organic light emitting display device 2 according to the comparative example, the number of masks utilized in the comparative example is greater than that utilized in the example embodiments of the present invention.

Figure 5G:
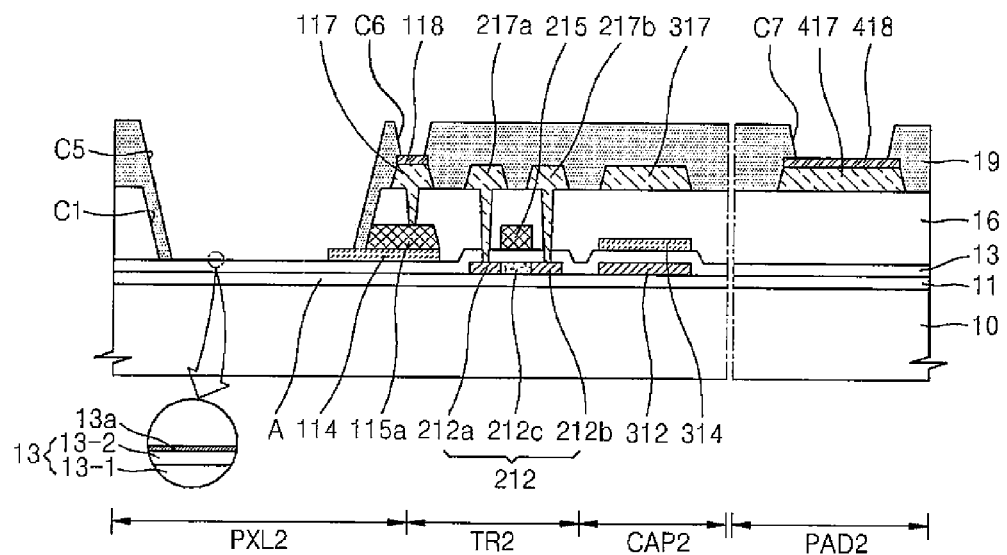

FIG. 5G is a schematic cross-sectional view illustrating a result of a seventh mask operation of the organic light emitting display device 2 according to the comparative example.

Referring to FIG. 5G, a third insulating layer 19 is formed on a resultant product of the sixth mask operation illustrated in FIG. 7F, and the third insulating layer 19 is patterned to form a contact hole C6 that exposes an upper portion of the second contact layer 118, a contact hole C7 that exposes an upper portion of the second pad layer 418, and an opening C5 in the pixel area PXL2 in which the pixel electrode 120, to be further described below, is to be formed. Because the opening C7 that exposes an upper portion of the second pad layer 418 is formed, there is a greater probability that defective pixels will be created or generated because the second pad layer 418 may not be protected from an etchant.

While a portion of the third contact layer 114 protrudes into the opening C5 of the third insulating layer 19 in the comparative example of FIG. 5G, in the previously described example embodiment, an additional opening C6 (see FIG. 3F) may be further formed in the third insulating layer 19 to thereby expose a portion of the third contact layer 114.

Figure 5H:
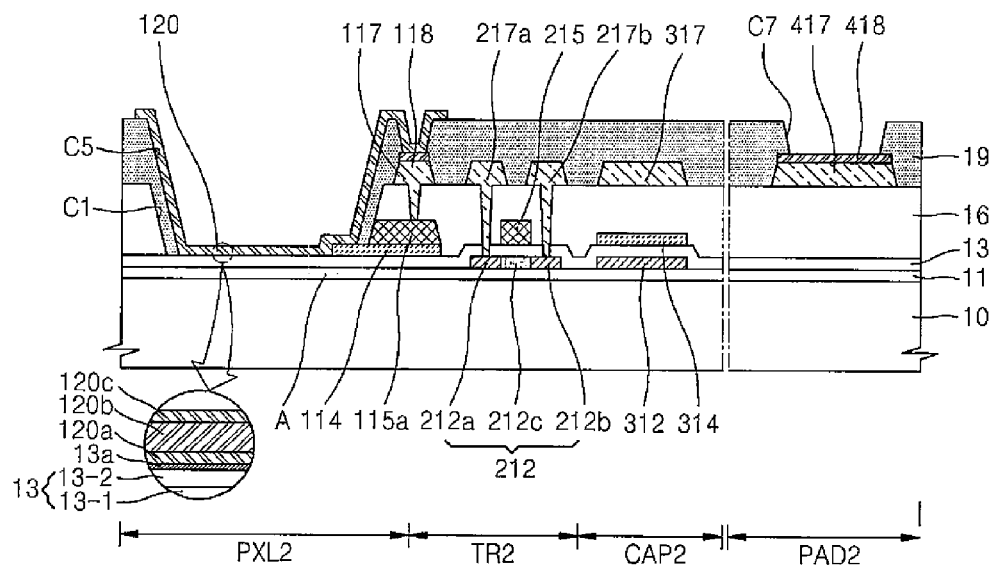

FIG. 5H is a schematic cross-sectional view illustrating a result of an eighth mask operation of the organic light emitting display device 2 according to the comparative example.

Referring to FIG. 5H, a semi-transmissive metal layer may be formed on a resultant product of the seventh mask operation illustrated in FIG. 5G, and the semi-transmissive metal layer may be patterned to form a pixel electrode 120.

The pixel electrode 120 includes a semi-transmissive metal layer 120b and transparent conductive oxide layers 120a and 120c that are respectively formed under and above the semi-transmissive metal layer 120b to protect the semi-transmissive metal layer 120b.

Figure 5I:
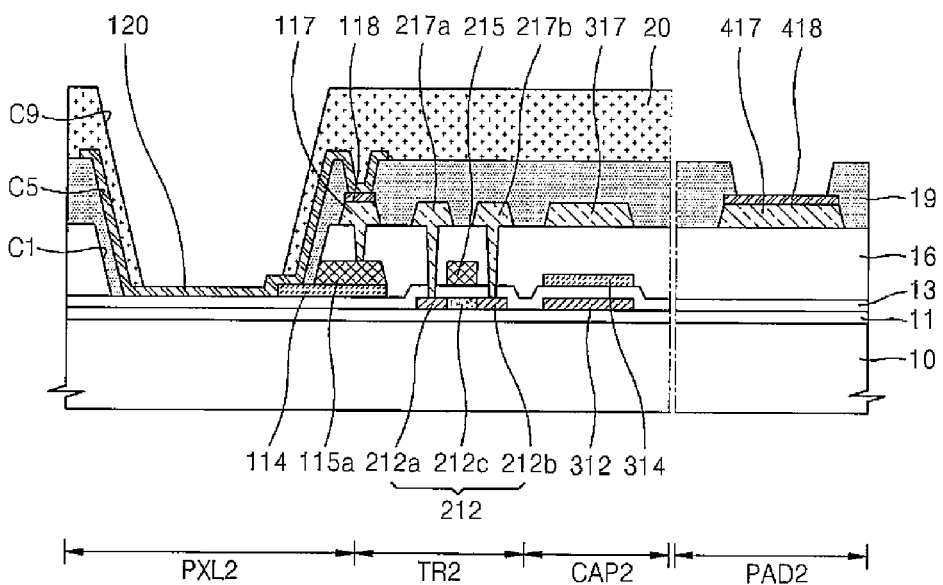

FIG. 5I is a schematic cross-sectional view illustrating a result of a ninth mask operation of the organic light emitting display device 2 according to the comparative example.

Referring to FIG. 5I, a ninth mask operation of forming a fourth insulating layer 20 on a resultant product of the eighth mask operation illustrated in FIG. 7G and then an opening C9 that exposes the opening C5 that exposes an upper portion of the pixel electrode 120 is formed.

An intermediate layer that includes the organic emitting layer 121 (see FIG. 4) is formed on a resultant product of the ninth operation illustrated in FIG. 5I, and an opposite electrode 122 (see FIG. 4) is then formed.

Here, due to silver (Ag) voids created or generated in the semi-transmissive metal layer 120b, impurities may penetrate into the organic emitting layer 121 and dark spot defects may be generated.

Thus, according to the organic light emitting display device 2 of the comparative example as described above, voids due to silver (Ag) particles from the pixel electrode 120 may exist or be created, and dark spot defects are caused. Therefore, an increase in light emission efficiency is not probable.

As described above, according to aspects of the above-described example embodiments of the organic light emitting display device and the method of manufacturing the organic light emitting display device, the following effects may be obtained.

First, a pixel electrode is formed of a semi-transmissive metal layer, and thus, light emission efficiency of a display device may be improved due to a micro-cavity structure.

Second, because a source electrode and a drain electrode (including data lines) are covered by a third insulating layer, which is an organic layer, when a pixel electrode is patterned, reprecipitation of silver (Ag) on to the source electrode and the drain electrode may be prevented.

Third, because a protection layer is formed on each of a first contact layer of a pixel electrode contact portion and a first pad layer of a pad electrode, reprecipitation of silver (Ag) on to the first contact layer and the first pad layer may be prevented.

Fourth, the source electrode, the drain electrode, the first contact layer, an upper portion of the first pad layer, and a protection layer formed on the first pad layer are formed using a single mask, and thus, the number of utilized masks may be reduced.

Fifth, when patterning a third insulating layer, a half-tone mask is used to form a thinner portion (e.g., a remaining layer) thereof that covers the protection layer on the first pad layer, and thus, the protection layer may be protected when the pixel electrode is patterned.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described herein with reference to the figures, it will be understood by those of ordinary skill in the art that various changes in form and details may be made therein without departing from the spirit and scope of the present invention as defined by the following claims and their equivalents.

What is claimed is:

1. An organic light emitting display device comprising:
   a thin film transistor comprising an active layer, a gate electrode, a source electrode, a drain electrode, a source electrode top layer on the source electrode, and a drain electrode top layer on the drain electrode, a first insulating layer between the active layer and the gate electrode, and a second insulating layer between the gate electrode and the source electrode and the drain electrode;
   a pad electrode comprising a first pad layer being a bottom-most layer of the pad electrode and being at the same level as the source electrode and the drain electrode, and a second pad layer on the first pad layer and at the same level as the source electrode top layer and the drain electrode top layer;

a third insulating layer covering end portions of the source electrode, the drain electrode, and the pad electrode, the third insulating layer comprising an organic insulating material;

a pixel electrode in an opening at the third insulating layer and comprising a semi-transmissive metal layer;

a fourth insulating layer having an opening corresponding to the opening at the third insulating layer and covering an end portion of the pixel electrode;

an organic emitting layer on the pixel electrode; and an opposite electrode on the organic emitting layer.

2. The organic light emitting display device of claim 1, wherein the second pad layer comprises a transparent conductive oxide.

3. The organic light emitting display device of claim 2, wherein the transparent conductive oxide comprises at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

4. The organic light emitting display device of claim 1, wherein the source electrode and the drain electrode each comprise a plurality of layers of metals having different electron mobilities.

5. The organic light emitting display device of claim 1, further comprising a capacitor comprising a first electrode at the same level as the active layer, and a second electrode at the same level as the gate electrode.

6. The organic light emitting display device of claim 5, wherein the second electrode of the capacitor comprises a transparent conductive oxide.

7. The organic light emitting display device of claim 5, wherein the capacitor further comprises a third electrode at the same level as the source electrode and the drain electrode, and a third electrode top layer on the third electrode and at the same level as the second pad layer.

8. The organic light emitting display device of claim 5, further comprising a pixel electrode contact portion that electrically couples the pixel electrode to the source electrode or the drain electrode through a contact hole in the third insulating layer; and wherein the pixel electrode contact portion further comprises a first contact layer comprising the same material as the source electrode and the drain electrode, a second contact layer comprising the same material as the second pad layer, and a third contact layer between the first and second insulating layers and comprising the same material as the second electrode of the capacitor, wherein the first contact layer is electrically coupled to the third contact layer through a contact hole in the second insulating layer.

9. The organic light emitting display device of claim 8, wherein an end portion of the third contact layer protrudes into the opening in the second insulating layer, and the pixel electrode contacts the end portion of the third contact layer through a contact hole in the third insulating layer.

10. The organic light emitting display device of claim 8, wherein the pixel electrode contact portion further comprises a fourth contact layer between the third contact layer and the first contact layer, and the pixel electrode contact portion comprises the same material as the gate electrode.

11. The organic light emitting display device of claim 1, wherein the first pad layer comprises the same material as the source electrode and the drain electrode.

12. The organic light emitting display device of claim 1, wherein the semi-transmissive metal layer comprises silver (Ag) or a silver (Ag) alloy.

13. The organic light emitting display device of claim 1, wherein an opening in the second insulating layer, an opening in the third insulating layer, and an opening in the fourth insulating layer overlap each other, and wherein the opening in the third insulating layer is larger than the opening in the fourth insulating layer but is smaller than the opening in the second insulating layer.

14. The organic light emitting display device of claim 1, wherein the opposite electrode comprises a reflective metal layer.

15. The organic light emitting display device of claim 1, wherein the first pad layer is on the second insulating layer, and wherein the second pad layer is exposed through the third insulating layer.

* * * * *